(12) United States Patent
Tang

(10) Patent No.: US 11,130,313 B2
(45) Date of Patent: Sep. 28, 2021

(54) ATTACHMENT APPARATUS AND METHOD FOR CURVED DISPLAY PANEL

(71) Applicant: WUHAN CHINA STAR OPTOELECTRONICS TECHNOLOGY CO., LTD, Wuhan (CN)

(72) Inventor: Yuejun Tang, Wuhan (CN)

( * ) Notice: Subject to any disclaimer, the term of this patent is extended or adjusted under 35 U.S.C. 154(b) by 440 days.

(21) Appl. No.: 16/307,485

(22) PCT Filed: Sep. 29, 2018

(86) PCT No.: PCT/CN2018/108651
§ 371 (c)(1),
(2) Date: Dec. 6, 2018

(87) PCT Pub. No.: WO2020/037785
PCT Pub. Date: Feb. 27, 2020

(65) Prior Publication Data
US 2021/0178729 A1    Jun. 17, 2021

(30) Foreign Application Priority Data
Aug. 24, 2018 (CN) .......................... 201810973402.8

(51) Int. Cl.
  B32B 17/06    (2006.01)
  B32B 7/12     (2006.01)
  (Continued)

(52) U.S. Cl.
  CPC .............. *B32B 17/06* (2013.01); *B29C 63/04* (2013.01); *B32B 7/12* (2013.01); *B32B 37/10* (2013.01);
  (Continued)

(58) Field of Classification Search
  CPC ............ B32B 37/0046; B32B 38/1866; B32B 2457/202; B32B 2457/206;
  (Continued)

(56) References Cited

U.S. PATENT DOCUMENTS 7,993,482 B2 * 8/2011 Begon ................ B29D 11/0073
                                                        156/307.5
9,594,268 B2 * 3/2017 Oh .......................... C03B 23/02
(Continued)

FOREIGN PATENT DOCUMENTS

CN    106710450 A  *  5/2017  ........... G06F 1/1681
CN    107039604 A  *  8/2017  ............. H01L 51/56
(Continued)

OTHER PUBLICATIONS

English translation of description of CN107039604.*
English translation of description of KR20160020701.*

*Primary Examiner* — Sonya M Sengupta

(57) ABSTRACT

An attachment apparatus and an attachment method for a curved display panel are provided. The attachment apparatus includes: a holding component for holding a cover glass in a curved state; a supporting component disposed under the holding component, and the supporting component including: a first mobile part and a second mobile part disposed opposite to each other, and a supporting part.

14 Claims, 3 Drawing Sheets

(51) Int. Cl.
*B32B 37/12* (2006.01)
*H01L 51/56* (2006.01)
*B32B 37/10* (2006.01)
*B29C 63/04* (2006.01)
*G09F 9/30* (2006.01)

(52) U.S. Cl.
CPC .............. *B32B 37/12* (2013.01); *H01L 51/56* (2013.01); *B32B 2457/206* (2013.01); *G09F 9/301* (2013.01); *Y10T 156/1028* (2015.01)

(58) Field of Classification Search
CPC ........ B32B 2037/1253; B32B 2309/68; B32B 2457/20; B32B 37/003; B32B 37/10; B32B 37/12; B32B 38/18; B32B 38/1858; B32B 2457/208; H01L 2251/5338; H01L 51/0024; H01L 51/524; H01L 51/5246; B29C 66/345; G02F 1/1303; G02F 1/133331; G02F 2001/133331; Y10T 156/1028; G09F 9/301

USPC .................................................. 156/285, 391
See application file for complete search history.

(56) References Cited

U.S. PATENT DOCUMENTS

| | | | |
|---|---|---|---|
| 10,212,865 B2* | 2/2019 | Son | .......................... H05K 13/00 |
| 10,500,820 B2* | 12/2019 | Lee | .......................... B32B 37/06 |
| 2014/0345791 A1* | 11/2014 | Son | ..................... H01L 51/0024 |
| | | | 156/228 |
| 2014/0345792 A1* | 11/2014 | Lee | ..................... B32B 37/0046 |
| | | | 156/228 |
| 2018/0086034 A1* | 3/2018 | Lee | ..................... B32B 37/1284 |
| 2018/0301643 A1* | 10/2018 | Xu | ......................... H01L 51/524 |

FOREIGN PATENT DOCUMENTS

| | | | | |
|---|---|---|---|---|
| CN | 107867040 A | * | 4/2018 | .......... B41M 7/0027 |
| KR | 20160020701 A | * | 2/2016 | |

* cited by examiner

ATTACHMENT APPARATUS AND METHOD FOR CURVED DISPLAY PANEL

FIELD OF INVENTION

The present application relates to a field of display panel manufacturing technology, and in particular to an attachment apparatus and an attachment method for a curved display panel.

BACKGROUND OF INVENTION

In recent years, organic light-emitting diodes (OLEDs) have become a popular emerging flat display device product at home and abroad. This is because OLED display devices are self-luminous, have wide viewing angles, short response times, high luminous efficiency, wide color gamut, low operating voltage, thin thickness, capable of manufacturing large sized panels, capable of manufacturing a flexible panel and is simple in process. Additionally, OLED also has potential for low cost.

With wide developments and applications of flexible OLED in the panel display industry, curved OLED hard screens have appeared on the market, which have a better sense of view.

Please refer to FIG. 1, where FIG. 1 is a cross-sectional view of a conventional curved OLED hard display panel, in which an adhesive layer is omitted for the purpose of clarity. As shown in FIG. 1, in order to protect an OLED display layer 1, a curved OLED hard display panel generally needs to attach a cover glass 2 (cover glass, CG) with a corresponding degree of curvature on the flexible OLED display panel layer 1. Currently, a method for manufacturing a curved OLED hard screen shown in FIG. 1 is: firstly, an OLED display panel layer 1 and the cover glass 2 are directly planarly bonded together by an adhesive (such as an optical tape (OCA) or a liquid optical adhesive (OCR)), and then curing. After that, the entire bonded OLED display panel layer 1 and cover glass is bent to obtain a desired bending curvature.

Technical Problem

Because an overall thickness of the display panel is increased after the planar bonding, it is not conducive to bending stress reduction, and cannot easily achieve bending the entire display panel into a pre-determined radius or curved shape, so that the application of the curved OLED hard display panel is limited.

In view of above, it is necessary to provide a new attachment method and apparatus for curved display panel to overcome the above drawbacks.

Technical Solutions of Present Application

In an attachment apparatus according the present application, by simply adjusting a curved curvature radius of a flexible display layer, it can achieve that a flexible display layer is directly attached on a pre-bent cover glass, so as to obtain a curved OLED hard display panel with a desired bending curvature.

In order to achieve the above objects, the present application provides an attachment apparatus for a curved display panel, including: a holding component for holding a cover glass in a curved state; a supporting component disposed under the holding component, and the supporting component including: a first mobile part and a second mobile part disposed opposite to each other, and a supporting part separately connected to the first mobile part and the second mobile part, for supporting a flexible display layer; wherein the holding component is connected to a moving device, and the moving device controls the holding component to be close to or away from the supporting component; and the first mobile part and the second mobile part are relatively movable to each other such that the supporting part is elastically deformed to be in a curved state to match a bending curvature of the cover glass.

In an embodiment of the present application, the attachment apparatus further includes a loading component disposed under the holding component for carrying the supporting component.

In an embodiment of the present application, at least a moving track is disposed on the supporting component, such that the first mobile part and the second mobile part separately moves along the moving track.

In an embodiment of the present application, the first mobile part and the second mobile part are correspondingly coupled with a servo motor which is configured to drive the first mobile part and the second mobile part.

In an embodiment of the present application, the servo motor is connected to a controller which is configured to control start and stop of the servo motor.

In an embodiment of the present application, the servo motor and the controller are correspondingly electrically connected to a power source.

In an embodiment of the present application, the supporting part is a flat structure.

In an embodiment of the present application, the attachment apparatus is disposed in a vacuum chamber.

In an embodiment of the present application, the supporting part is made of metal.

Another object of the present application is to provide an attachment method for a curved display panel that can directly attach a flexible display layer on a pre-bent cover glass, so as to obtain a curved OLED hard display panel with a desired bending curvature.

In order to achieve the above objects, the present application further provides an attachment method for a curved display panel, including: providing the cover glass and sucking the cover glass by the holding component; providing the flexible display layer and disposing the flexible display layer on the supporting part to face the cover glass; moving the first mobile part and the second mobile part to approach each other, so that the supporting part is elastically deformed into a curved state until a curvature radius of the supporting part is smaller than a curvature radius of the cover glass, thereby attaching a portion of the flexible display layer to the cover glass; moving the first mobile part and the second mobile part away from each other, and controlling the holding component to approach the supporting component by the moving device until the curvature radius of the supporting part is equal to the curvature radius of the cover glass, thereby the flexible display layer is completely attached to the cover glass.

In an embodiment of the present application, an optical adhesive is coated on a surface of the cover glass.

In an embodiment of the present application, the optical adhesive is coated on the surface of the cover glass before the cover glass is sucked by the holding component.

In an embodiment of the present application, an optical adhesive is coated on a surface of the flexible display layer.

It can be understood by those skilled in the art that the cover glass may be a flexible glass, and the flexible display layer may include a thin-film transistor (TFT) array substrate and OLED devices. Unless otherwise stated, the servo motor is correspondingly coupled to a controller and a power source to achieve the known effects of servo motors in the art.

In the present application, the cover glass is fixed into a predetermined curved state by the holding component, and then a curved curvature radius of the flexible display layer is smaller than a curved curvature radius of the cover glass by adjusting the first mobile part and the second mobile part, so a middle portion of the flexible display layer is firstly adhered to the cover glass, and then the curved curvature radius of the flexible display layer is gradually increased to finally completely adhere to the cover glass, thereby obtaining a curved OLED hard display panel with a desired curved bending curvature.

Beneficial Effect of Present Application

In the present application, the cover glass is fixed into a predetermined curved state by the holding component, and then a curved curvature radius of the flexible display layer is smaller than a curved curvature radius of the cover glass by adjusting the first mobile part and the second mobile part, so a middle portion of the flexible display layer is firstly adhered to the cover glass, and then the curved curvature radius of the flexible display layer is gradually increased to finally completely adhere to the cover glass, thereby obtaining a curved OLED hard display panel with a desired curved bending curvature.

DRAWINGS

In order to more clearly illustrate the technical solutions in the embodiments of the present application, the drawings used in the description of the embodiments will be briefly described below. It is apparent that the drawings accompanying with the following description are only some embodiments of the present application. Other drawings can also be obtained from those skilled in the art based on these drawings without paying any creative effort.

DETAILED DESCRIPTION OF PREFERRED EMBODIMENTS

Figure 1:
FIG. 1 is a cross-sectional view of a conventional curved organic light emitting diode (OLED) hard display panel.

The embodiments of the present invention are described in detail below, and the examples of the implementation are illustrated in the drawings, and the same or similar reference numerals indicate the same or similar elements or elements having the same or similar functions. The embodiments described below with reference to the drawings are intended to be illustrative of the present invention and cannot be understood as limitations of the present invention.

In the present invention, unless otherwise expressly stated and defined, a first feature "above" or "under" a second feature may include that the first feature directly contacts with the second feature, and may also include that the first feature does not directly contact with the second feature. Moreover, the first feature "on", "above" and "over" the second feature includes the first feature right above and oblique upper the second feature, or merely indicating that a level of the first feature is higher than a level of the second feature. The first feature "below", "under" and "beneath" the second feature includes the first feature right below and oblique below the second feature, or merely indicating that a level of first feature is less than a level of the second feature.

The following disclosure provides many different embodiments or examples for implementing different structures of the present invention. In order to simplify the disclosure of the present invention, the components and arrangements of the specific examples are described below. Certainly, they are merely examples and are not intended to limit the invention. In addition, the present invention may be repeated with reference numerals and/or reference letters in the different examples, which are for the purpose of simplicity and clarity, and do not indicate the relationship between the various embodiments and/or arrangements discussed. Moreover, the present invention provides examples of various specific processes and materials, but one of ordinary skill in the art will recognize that other processes and/or the use of other materials can be used.

Figure 2:
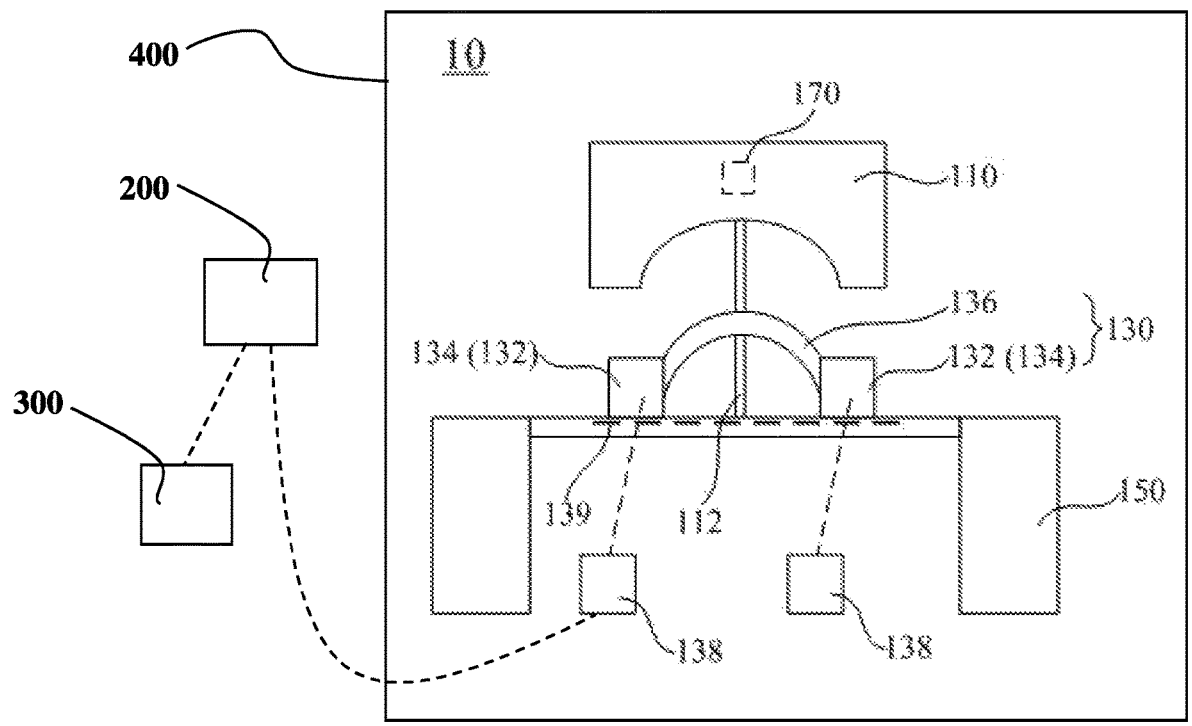
FIG. 2 is a schematic structural view of an attachment apparatus according to the present application.

Referring to FIG. 2, an attachment apparatus 10 for a curved display panel is provided in this embodiment. As shown in FIG. 2, the attachment apparatus 10 includes a holding component 110, a supporting component 130, and a loading component 150. Wherein, the supporting component 130 is disposed under the holding component 110. The loading component 150 is disposed under the holding component 110 and configured as carrying the supporting component 130.

As shown in FIG. 2, the supporting component 130 includes: a first mobile part 132 and a second mobile part 134 disposed opposite to each other, and a supporting part 136. The supporting part 136 is separately connected to the first mobile part 132 and the second mobile part 134, and configured to support a flexible display layer (described in detail below).

As shown in FIG. 2, the holding component 110 is connected to a moving device, the moving device controls the holding component 110 to approach or away from the supporting component 130. The moving device is any known device that can achieve relative movement, such as a moving device 170 shown in FIG. 2. As an exemplary embodiment, as shown in FIG. 2, the moving device 170 can make the holding component 110 to move along a moving guiding track 112 such that the holding component 110 can approach or move away from the supporting component 130.

As shown in FIG. 2, the loading component 150 is configurate to carry the supporting component 130. Moreover, at least one moving track (such as the moving track 139 shown in FIG. 2) is disposed on the supporting component 130, so that the first mobile part 132 and the second mobile part 134 can move relative to each other (for example, moving in the left and right direction in FIG. 2) along the moving track 139. Because the supporting part 136 is separately connected to the first mobile part 132 and the second mobile part 134, when the first mobile part 132 and the second mobile part 134 are away from each other in FIG. 2, the supporting part 136 is drawn, so the bending curvature diameter of the supporting part 136 is increased (i.e. becomes more flat); and when the first mobile part 132 and the second mobile part 134 are approaching to each other in FIG. 2, the supporting part 136 is compressed, so the bending curvature diameter of the supporting part 136 becomes smaller (i.e. becomes more curved).

It will be understood by those skilled in the art that the first mobile part 132 and the second mobile part 134 are correspondingly electrically connected to a servo motor 138, and the operation of the servo motor 138 can be controlled by a controller 200 to control the movement of first mobile part 132 and second mobile part 134. The servo motor 138 and the controller 200 may be devices which are in the fields to achieve controlling components moving. Certainly, the servo motor 138 and the controller 200 are electrically connected to a power source 300.

Moreover, it will be understood by those skilled in the art that the attachment apparatus may be disposed within the vacuum chamber 400 to comply with general requirements for display assembly in the field of display.

The operation manner of the attachment apparatus 10 and the attachment method provided by the present application are described below accompanying with FIGS. 3A to 3C. In order to make the drawing clearer, the reference numerals of some components and the servo motor 138 are omitted. Moreover, the direction of the arrow shown in the drawing is the moving direction of the component.

Figure 3A:
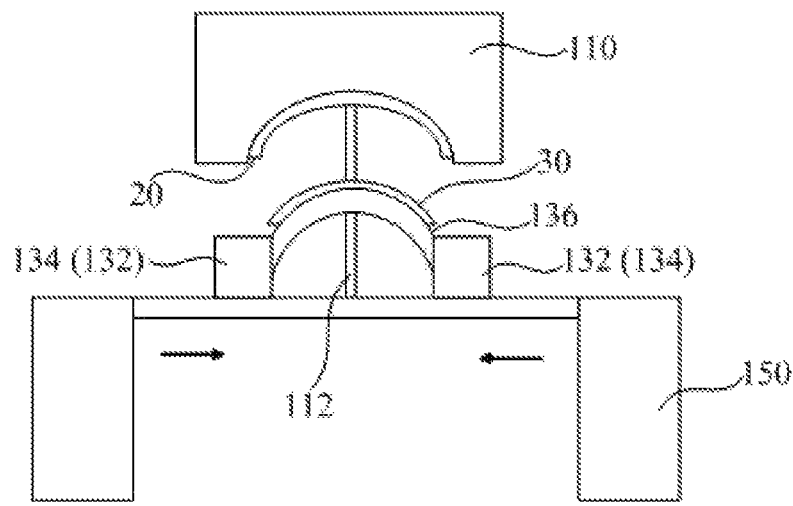
FIGS. 3A-3C are process schematic views of forming a curved display panel using an attachment apparatus according to the present application.

FIG. 3A shows an initial position of an attachment apparatus 10 according to the present application. As shown in FIG. 3A, a cover glass 20 and a flexible display layer 30 are firstly provided, so that the cover glass 20 is sucked by the holding component 110, and the flexible display layer 30 is disposed on the supporting part 136 and facing the cover glass 20. It will be understood by those skilled in the art that the cover glass 20 may be a flexible glass, and the flexible display layer 30 may be a known flexible display panel layer, such as a flexible organic light emitting diode (OLED) display layer including a thin-film transistor (TFT) array substrate and OLED devices.

In order to adhere the cover glass 20 and the flexible display layer 30, an optical adhesive may be applied on a surface of the cover glass 20 or the flexible display layer 30, and the optical adhesive may be an optical tape (OCA) or a liquid optical adhesive (OCR).

Certainly, in order to facilitate the application of the optical adhesive, an optical adhesive may be firstly applied on a surface of the cover glass 20 which is in a flat state, and then the cover glass 20 is sucked by the holding component 110, and make the optical adhesive to face the flexible display layer 30.

Subsequently, the first mobile part 132 and the second mobile part 134 are approaching to each other along a direction of an arrow shown in FIG. 3A. In this way, the supporting part 136 is compressed so as to cause elastically deforming and bending until a curvature radius of the supporting part 136 is smaller than a curvature radius of the cover glass 20. The holding component 110 is moved down along the moving guiding track 112 such that a portion (such as a middle portion) of the flexible display layer 30 adheres to the cover glass 30 as shown in FIG. 3B.

Figure 3B:
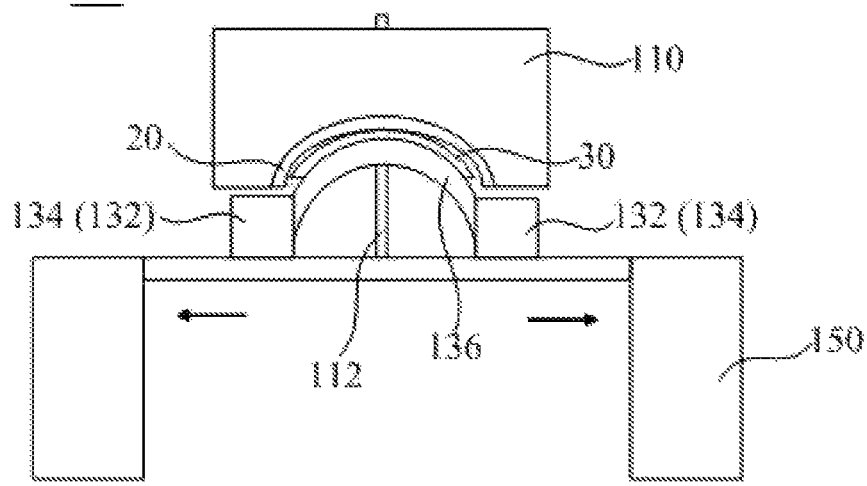
Figure 3C:
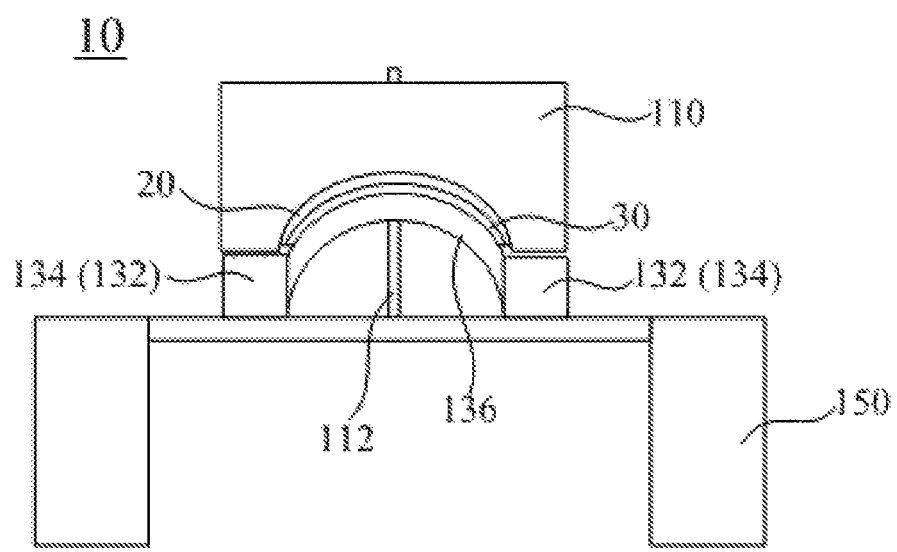

Next, the first mobile part 132 and the second mobile part 134 are moved away from each other along a direction of an arrow in FIG. 3B, and the holding component 110 continues to move down along the moving guiding track 112 until a curvature radius of the supporting part 136 is equal to a curvature radius of the cover glass 20 such that the flexible display layer 30 completely adheres to the cover glass 20, as shown in FIG. 3C.

As shown in FIG. 3A to FIG. 3C, in the present application, the cover glass 20 is fixed into a predetermined curved state by the holding component 110, and then a curved curvature radius of the flexible display layer 30 is smaller than a curved curvature radius of the cover glass 20 by adjusting the first mobile part 132 and the second mobile part 134, so a middle portion of the flexible display layer 30 is firstly adhered to the cover glass 20, and then the curved curvature radius of the flexible display layer 30 is gradually increased to finally completely adhere to the cover glass 20, thereby obtaining a curved OLED hard display panel with a desired curved bending curvature.

The present application has been described by the above related embodiments, but the above embodiments are merely examples for implementing the present application. It must be noted that the disclosed embodiments do not limit the scope of the application. In contrast, modifications and equivalent arrangements included in the spirit and scope of the claims are included within the scope of the application.

The invention claimed is:

1. An attachment apparatus for a curved display panel, comprising:
   a holding component for holding a cover glass in a curved state;
   a supporting component disposed under the holding component, and the supporting component including:
   a first mobile part and a second mobile part disposed opposite to each other, and
   a supporting part separately connected to the first mobile part and the second mobile part, for supporting a flexible display layer;
   wherein the holding component is connected to a moving device, and the moving device controls the holding component to be close to or away from the supporting component; and
   the first mobile part and the second mobile part are relatively movable to each other such that the supporting part is elastically deformed to be in a curved state to match a bending curvature of the cover glass,
   wherein the attachment apparatus further comprises a loading component disposed under the holding component for carrying the supporting component, and
   wherein at least a moving track is disposed on the supporting component, such that the first mobile part and the second mobile part separately moves along the moving track.

2. The attachment apparatus according to claim 1, wherein the supporting part is a flat structure.

3. The attachment apparatus according to claim 1, wherein the attachment apparatus is disposed in a vacuum chamber.

4. The attachment apparatus according to claim 1, wherein the supporting part is made of metal.

5. An attachment method for a curved display panel using the attachment apparatus according to claim 1, comprising:
   providing the cover glass and sucking the cover glass by the holding component;
   providing the flexible display layer and disposing the flexible display layer on the supporting part to face the cover glass;
   providing a loading component disposed under the holding component for carrying the supporting component;
   providing at least a moving track is disposed on the supporting component, such that the first mobile part and the second mobile part separately moves along the moving track,
   wherein the first mobile part and the second mobile part are correspondingly coupled with a servo motor which is configured to drive the first mobile part and the second mobile part;
   moving the first mobile part and the second mobile part to approach each other, so that the supporting part is elastically deformed into a curved state until a curvature radius of the supporting part is smaller than a curvature radius of the cover glass, thereby attaching a portion of the flexible display layer to the cover glass;

moving the first mobile part and the second mobile part away from each other, and controlling the holding component to approach the supporting component by the moving device until the curvature radius of the supporting part is equal to the curvature radius of the cover glass, thereby the flexible display layer is completely attached to the cover glass.

6. The attachment method according to claim 5, wherein an optical adhesive is coated on a surface of the cover glass.

7. The attachment method according to claim 6, wherein the optical adhesive is coated on the surface of the cover glass before the cover glass is sucked by the holding component.

8. The attachment method according to claim 5, wherein an optical adhesive is coated on a surface of the flexible display layer.

9. An attachment apparatus for a curved display panel, comprising:
a holding component for holding a cover glass in a curved state;
a supporting component disposed under the holding component, and the supporting component including:
a first mobile part and a second mobile part disposed opposite to each other, and
a supporting part separately connected to the first mobile part and the second mobile part, for supporting a flexible display layer;
wherein the holding component is connected to a moving device, and the moving device controls the holding component to be close to or away from the supporting component; and
the first mobile part and the second mobile part are relatively movable to each other such that the supporting part is elastically deformed to be in a curved state to match a bending curvature of the cover glass,
wherein the first mobile part and the second mobile part are correspondingly coupled with a servo motor which is configured to drive the first mobile part and the second mobile part.

10. The attachment apparatus according to claim 9, wherein the servo motor is connected to a controller configured to control start and stop of the servo motor.

11. The attachment apparatus according to claim 10, wherein the servo motor and the controller are correspondingly electrically connected to a power source.

12. The attachment apparatus according to claim 9, wherein the supporting part is a flat structure.

13. The attachment apparatus according to claim 9, wherein the attachment apparatus is disposed in a vacuum chamber.

14. The attachment apparatus according to claim 9, wherein the supporting part is made of metal.

* * * * *